(12) United States Patent
Ko et al.

(10) Patent No.: US 9,379,296 B2
(45) Date of Patent: Jun. 28, 2016

(54) SILICONE RESIN

(71) Applicant: LG CHEM, LTD., Seoul (KR)

(72) Inventors: Min Jin Ko, Daejeon (KR); Myung Sun Moon, Daejeon (KR); Jae Ho Jung, Daejeon (KR); Bum Gyu Choi, Daejeon (KR); Dae Ho Kang, Daejeon (KR); Min Kyoun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/143,854

(22) Filed: Dec. 30, 2013

(65) Prior Publication Data

US 2014/0111976 A1    Apr. 24, 2014

Related U.S. Application Data

(63) Continuation-in-part of application No. 13/555,574, filed on Jul. 23, 2012, now Pat. No. 8,916,671, which is a continuation of application No. PCT/KR2011/000521, filed on Jan. 25, 2011.

(30) Foreign Application Priority Data

Jan. 25, 2010   (KR) .................. 10-2010-0006701
Jan. 25, 2011   (KR) .................. 10-2011-0007456

(51) Int. Cl.
  *H01L 33/56*   (2010.01)
  *C08G 77/20*   (2006.01)
  *H01L 23/29*   (2006.01)
  *C08L 83/04*   (2006.01)
  *C09K 3/10*    (2006.01)
  *C08G 77/12*   (2006.01)
  *C08K 5/56*    (2006.01)
  *C08G 77/00*   (2006.01)

(52) U.S. Cl.
  CPC .............. *H01L 33/56* (2013.01); *C08G 77/20* (2013.01); *C08L 83/04* (2013.01); *C09K 3/1018* (2013.01); *H01L 23/296* (2013.01); *C08G 77/12* (2013.01); *C08G 77/80* (2013.01); *C08K 5/56* (2013.01); *H01L 2924/0002* (2013.01)

(58) Field of Classification Search
  None
  See application file for complete search history.

(56) References Cited

U.S. PATENT DOCUMENTS

| | | | | |
|---|---|---|---|---|
| 4,972,005 A | * | 11/1990 | Aoki et al. | ....................... 522/99 |
| 7,858,198 B2 | * | 12/2010 | Kashiwagi et al. | ............ 428/447 |
| 8,129,480 B2 | * | 3/2012 | Takanashi et al. | ............. 525/477 |
| 2006/0081864 A1 | | 4/2006 | Nakazawa | |
| 2009/0105395 A1 | | 4/2009 | Kamata et al. | |
| 2009/0146175 A1 | * | 6/2009 | Bahadur et al. | ................ 257/100 |

FOREIGN PATENT DOCUMENTS

| | | | |
|---|---|---|---|
| JP | 2000169714 A | | 6/2000 |
| JP | 2005-343998 A | | 12/2005 |
| JP | 2008-001828 A | | 1/2008 |
| JP | 2009185226 A | | 8/2009 |
| KR | 1020060016107 A | | 2/2006 |
| KR | 1020080008286 A | | 1/2008 |
| KR | 1020090077955 A | | 7/2009 |
| WO | 2007100445 A2 | | 9/2007 |
| WO | 2007125785 A1 | | 11/2007 |
| WO | WO 2010/050625 | * | 5/2010 |

OTHER PUBLICATIONS

International Search Report issued in International Appn. No. PCT/KR2011/000521, mailed Oct. 21, 2011, 2 pages.
Office Action issued in related Japanese Patent Application No. 2012-549950 on Oct. 6, 2014, 3 pages.

* cited by examiner

*Primary Examiner* — Marc Zimmer
(74) *Attorney, Agent, or Firm* — Rothwell, Figg, Ernst & Manbeck, P.C.

(57) ABSTRACT

A silicone resin is provided. The silicone resin may be effectively used to encapsulate a semiconductor element, for example, a light-emitting element of a light-emitting diode.

15 Claims, No Drawings

US 9,379,296 B2

SILICONE RESIN

CROSS-REFERENCE TO RELATED APPLICATION

This application is a continuation-in-part of U.S. patent application No. 13/555,574, filed on Jul. 23, 2012, which is a continuation application of International Application PCT/KR2011/000521, with an international filing date of Jan. 25, 2011, which claims priority to and the benefit of Korean Patent Application No. 10-2010-0006701, filed Jan. 25, 2010, and of Korean Patent Application No. 10-2011-0007456, filed Jan. 25, 2011, the disclosure of which are incorporated herein by reference in their entireties.

TECHNICAL FIELD

The present application relates to a silicone resin.

BACKGROUND ART

As a LED (light emitting diode), particularly as a blue or an UV LED that has an emission wavelength of approximately 250 nm to 550 nm, a high-brightness LED product using a compound semiconductor of a GaN compound such as GaN, GaAlN, InGaN or InAlGaN has been obtained. Also, a high-definition full color image may be formed using a technique to combine red and green LEDs with a blue LED. For example, a technique to prepare a white LED by combining a blue LED or an UV LED with a phosphor has been known. Such LEDs have been increasingly required for general lighting or backlight in liquid crystal displays (LCDs).

As an encapsulant for the LEDs, an epoxy resin that has high adhesive strength and excellent dynamic durability has been widely used. However, the epoxy resin has problems in that it has low transmittance with respect to light having blue to UV wavelength regions, and also shows deteriorated light-fastness. Therefore, techniques of solving the above-described problems have been proposed, for example, in Japanese Patent Laid-Open Publication Nos. Hei11-274571, 2001-196151 and 2002-226551. However, encapsulants described in this literature show insufficient lightfastness.

As a material having excellent lightfastness with respect to a low wavelength range, a silicone resin has been known. However, the silicone resin has disadvantages in that its heat resistance is poor, and its surface is sticky after curing. Also, in order to effectively apply the silicone resin as an LED encapsulant, characteristics such as a high refractive property, crack resistance, surface hardness, adhesive strength and thermal shock resistance must be secured.

DISCLOSURE

Technical Problem

An object of the present application includes providing a silicone resin.

Technical Solution

The present application relates to a silicone resin. The silicone resin may be represented by an average composition formula of Formula 1. The silicone resin may include a siloxane unit of Formula 2 and a siloxane unit of

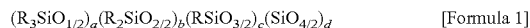

[Formula 1]

[Formula 2]

[Formula 3]

wherein, R's are substituents directly bound to a silicon atom, and each independently represents hydrogen, an alkoxy group, a hydroxy group, an epoxy group, a (meth)acryloyl group, an isocyanate group or a monovalent hydrocarbon group, $R^1$ and $R^2$ each independently represent an alkyl group and an aryl group, $R^3$ represents an aryl group, a is in a range of $0 \leq a \leq 0.5$, b is in a range of $0 < b \leq 0.8$, c is in a range of $0 < c \leq 0.8$, and d is in a range of $0 \leq d \leq 0.2$, with the proviso that $a+b+c+d$ is 1 and at least one of $R^1$ and $R^2$ represents an aryl group.

The silicone resin may be represented by the average composition formula of Formula 1. The term "silicone resin or polyorganosiloxane being represented by a certain average composition formula" as used herein may refer to the case where the resin or polyorganosiloxane comprises a single resin or polyorganosiloxane that is represented by the certain average composition formula as well as the case where the resin or polyorganosiloxane includes a mixture of at least two resins or polyorganosiloxanes, and an average composition of the at least two resins or polyorganosiloxanes is represented by the certain average composition formula.

The silicone resin includes both a bifunctional unit represented by Formula 2 and a trifunctional unit represented by Formula 3 as siloxane units included in the resin. Therefore, the silicone resin shows excellent optical characteristics such as a refractive index, and may for example show excellent light extraction efficiency in its application to LEDs. Also, the silicone resin shows low viscosity at the time of its application, has excellent processability and workability, and shows excellent crack resistance, hardness, thermal shock resistance and adhesive strength after its application. Also, the silicone resin has excellent long-term reliability under high-temperature and/or high-moisture conditions, and also prevents turbidity and stickiness on the surface under high-temperature and/or high-moisture conditions.

In Formula 1, R's are substituents that are directly bound to the silicon atom. Also, the R's may be the same or different from each other, and each independently represent hydrogen, a hydroxy group, an epoxy group, an acryloyl group, a methacryloyl group, an isocyanate group, an alkoxy group or a monovalent hydrocarbon group. In this case, Rs may be substituted with one or more substituents, when necessary.

In Formula 1, the alkoxy group may be a linear, branched or cyclic alkoxy group having 1 to 12 carbon atoms, preferably 1 to 8 carbon atoms, and more preferably 1 to 4 carbon atoms, and, more particularly, may include a methoxy group, an ethoxy group, a propoxy group, an isopropoxy group, a butoxy group, an isobutoxy group or a tert-butoxy group.

In Formula 1, the monovalent hydrocarbon group may, for example, be an alkyl group, an alkenyl group, an aryl group or an arylalkyl group, preferably an alkyl group, an alkenyl group or an aryl group.

In Formula 1, the alkyl group may be a linear, branched or cyclic alkyl group having 1 to 12 carbon atoms, preferably 1 to 8 carbon atoms, and more preferably 1 to 4 carbon atoms, preferably a methyl group.

In Formula 1, the alkenyl group may be an alkenyl group having 2 to 12 carbon atoms, preferably 2 to 8 carbon atoms, and more preferably 2 to 4 carbon atoms, preferably a vinyl group.

In Formula 1, the aryl group may be an aryl group having 6 to 18 carbon atoms, and preferably 6 to 12 carbon atoms, preferably a phenyl group.

In Formula 1, the arylalkyl group may be an arylalkyl group having 6 to 19 carbon atoms, and preferably 6 to 13 carbon atoms, and be, for example, a benzyl group.

In Formula 1, at least one of the R's is an aryl group, preferably a phenyl group. Also, the aryl group may, for example, be included in the siloxane unit of Formula 2 or 3.

At least one of the R's in Formula 1 may preferably be a hydroxy group, an epoxy group, an acryloyl group, a methacryloyl group or a vinyl group, and more preferably an epoxy group. Such a functional group may further improve adhesive strength of an encapsulant.

In Formula 1, a, b, c and d represent mole fractions of the siloxane units, respectively, and the total sum of a, b, c and d is 1. Also in Formula 1, a may be in a range of 0 to 0.5, preferably in a range of 0 to 0.4, b may be greater than 0 and 0.8 or less, preferably greater than 0 and 0.7 or less, c may be greater than 0 and 0.8 or less, preferably greater than 0 and 0.7 or less, and d is in a range of 0 to 0.2, preferably in a range of 0 to 0.15.

The silicone resin includes at least one aryl group, preferably a phenyl group, which is bound to the silicon atom. Preferably, in the silicone resin, a molar ratio (Ar/Si) of the aryl group (Ar) bound to the silicon atom with respect to the total silicon atoms (Si) in the resin may be in a range of 0.7 to 1.3, preferably in a range of 0.7 to 1.2. When the molar ratio (Ar/Si) is within this range, it is possible to maintain excellent refractive index, light extraction efficiency, crack resistance, hardness and viscosity of the silicone resin or an encapsulant including the silicone resin.

In one embodiment, the silicon atoms to which the aryl groups are bound are preferably distributed and included in the siloxane unit of Formula 2 and the siloxane unit of Formula 3. More preferably, all the silicon atoms to which the aryl groups in the resin are bound are included in the siloxane unit of Formula 2 or 3.

In the above, the siloxane unit of Formula 2 is a difunctional siloxane unit, and $R^1$ and $R^2$ in Formula 2 each independently represent an alkyl group or an aryl group, in which at least one of $R^1$ and $R^2$ is an aryl group. In this case, specific kinds of the alkyl group and aryl group are the same as described in connection with the R's above, and the alkyl group in Formula 2 is preferably a methyl group, and the aryl group is preferably a phenyl group.

In one embodiment, the siloxane unit of Formula 2 may preferably be a siloxane unit of the Formula 4 and/or 5:

  [Formula 4]

  [Formula 5].

In another embodiment, the siloxane unit of Formula 2 may preferably be a siloxane unit of the Formula 5. The molar ratio ($100 \times D_5/D$) of the difunctional siloxane unit ($D_5$) of Formula 5 with respect to the total difunctional siloxane units (D) in the silicone resin may be 30% or more. The molar ratio ($100 \times D_5/D$) may also be in the range from 30% to 65% or from 30% to 60%. If the molar ratio ($100 \times D_5/D$) is 30% or more, it may be possible to provide the silicone resin capable of preventing tackiness on the surface from being generated and having excellent mechanical strength, water and gas transmission properties, and long-term reliability even under high-temperature and/or high-moisture conditions.

In the silicone resin, a molar ratio (Ar/Si) of the aryl group (Ar) in the siloxane unit of Formula 2 with respect to the total silicon atoms (Si) in the resin may be in a range of 0.3 to 0.8, preferably in a range of 0.4 to 0.7. When the molar ratio (Ar/Si) is adjusted to 0.3 or more, it is possible to maintain excellent viscosity, refractive index and moisture resistance of the silicone resin, whereas when the molar ratio (Ar/Si) is adjusted to 0.8 or less, it is possible to maintain excellent hardness of the silicone resin.

In the silicone resin, a ratio of the siloxane unit of Formula 2 with respect to the total bifunctional siloxane units in the resin may also be 35 mol % or more, preferably 40 mol % or more. When such a content (mol %) is within this range, it is possible to maintain excellent light extraction efficiency, crack resistance, hardness and viscosity of the silicone resin or an encapsulant including the silicone resin. As such, an upper limit of the term "mol %" is not particularly limited, but is, for example, 100 mol %.

Formula 3 represents a trifunctional siloxane unit that includes aryl groups directly bound to the silicon atom. Specific examples of the aryl group are the same as described in connection with the R's above, and the aryl group may be preferably a phenyl group.

The siloxane unit of Formula 3 may be represented by Formula 6.

  [Formula 6]

In the silicone resin, a molar ratio (Ar/Si) of aryl group (Ar) in the siloxane unit of Formula 3 with respect to the total silicon atoms (Si) in the resin may be in a range of 0.25 to 0.7, preferably in a range of 0.25 to 0.7. When the molar ratio (Ar/Si) is adjusted to the above-mentioned range, it is possible to maintain excellent hardness, refractive index and viscosity of the silicone resin or the encapsulant.

In the silicone resin, a ratio of the siloxane unit of Formula 3 with respect to the total trifunctional siloxane units in the resin may also be 70 mol % or more, preferably 80 mol % or more. When such a content (mol %) is within this range, it is possible to maintain excellent light extraction efficiency, crack resistance, hardness and viscosity of the silicone resin or an encapsulant including the silicone resin. As such, an upper limit of the term "mol %" is not particularly limited, but is, for example, 100 mol %.

The silicone resin may, for example, have a viscosity at 25° C. of 500 cP to 100,000 cP, preferably 500 cP to 50,000 cP. When the viscosity of the silicone resin is within this range, it is possible to maintain excellent processability and hardness of the silicone resin.

According to the present application, the silicone resin may have a molecular weight of 300 to 100,000, preferably 300 to 50,000, and more preferably 500 to 30,000. When the molecular weight of the resin is adjusted to the above-mentioned range, the encapsulant has excellent hardness, and may also show excellent processability. In this document, unless stated otherwise, the term "molecular weight" refers to a weight average molecular weight ($M_w$). Also, a weight average molecular weight refers to a value that is a converted value with respect to standard polystyrene and that is measured by gel permeation chromatography (GPC).

The silicone resin may be prepared in various methods known in the art. For example, the silicone resin may be prepared, for example, using an addition-curable silicone material, a condensation-curable or polycondensation-curable silicone material, a UV-curable silicone material or a peroxide-vulcanized silicone material, and preferably be prepared using an addition-curable silicone material, a condensation-curable or polycondensation-curable silicone material or a UV-curable silicone material.

The addition-curable silicone material is cured by hydrosilylation. This material includes at least an organic silicon compound having hydrogen atoms directly bound to silicon atom and an organic silicon compound having an unsaturated aliphatic group such as a vinyl group and the organic silicon compounds react to each other to be cured in the presence of a catalyst. Examples of the catalyst may include metals in Group VIII of the Periodic Table, catalysts for supporting the metals to a carrier such as alumina, silica or carbon black, salts or complexes of the metals. The metals in Group VIII of the Periodic Table which may be used herein include platinum, rhodium or ruthenium, although platinum is preferred.

In case where the silicone resin is prepared from the addition-curable silicone material, the silicone resin may be derived from a polymerized product including a linear polyorganosiloxane that is represented by an average composition formula of Formula 7.

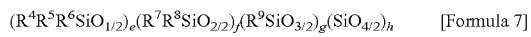

$(R^4R^5R^6SiO_{1/2})_e(R^7R^8SiO_{2/2})_f(R^9SiO_{3/2})_g(SiO_{4/2})_h$    [Formula 7]

wherein $R^4$ to $R^9$ independently represent an alkoxy group, a hydroxy group, an epoxy group or a monovalent hydrocarbon group, with the provision that at least one of $R^4$ to $R^9$ is an alkenyl group, at least one of $R^4$ to $R^9$ is an aryl group; e is in a range of 0 to 0.5, f is in a range of 0.5 to 0.98, g is in a range of 0 to 0.2, h is in a range of 0 to 0.1, with the proviso that e+f+g+h is 1, (e+f)/(e+f+g+h) is greater than 0.9.

In the Formula 7, specific examples of the alkoxy and monovalent hydrocarbon groups may be the same as defined in Formula 1.

In Formula 7, at least one of $R^4$ to $R^9$ is an alkenyl group. Specifically, the alkenyl group may be included in such an amount that the molar ratio (Ak/Si) of the alkenyl group (Ak) bound to a silicon atom with respect to the total silicon atoms (Si) in the linear polyorganosiloxane is in a range of 0.02 to 0.2, preferably 0.02 to 0.15. If the molar ratio (Ak/Si) is more than 0.02, it is possible to suitably maintain reactivity with the hydrogen siloxane compound, and prevent components that have not reacted from bleeding on the surface of the silicone resin. Also, if the molar ratio (Ak/Si) is less than 0.2, it is possible to maintain excellent crack resistance of the silicone resin.

In Formula 7, at least one of $R^4$ to $R^9$ may be an aryl group, preferably a phenyl group. Therefore, the refractive index and hardness characteristics of the silicone resin may be effectively controlled. Specifically, the aryl group, preferably the phenyl group, may be included in such an amount that the molar ratio (Ar/Si) of the aryl group (Ar) with respect to the total silicon atoms (Si) in the linear polyorganosiloxane is in a range of 0.3 to 1.3, preferably 0.4 to 1.3, and more preferably 0.6 to 1.3. If the molar ratio (Ar/Si) is not less than 0.3, it is possible to optimize the refractive index and hardness of the silicone resin, and if the molar ratio (Ar/Si) is not more than 1.3, it is possible to optimize viscosity.

In the above, e, f, g and f in the average composition formula of Formula 1 represent molar ratios of the siloxane units respectively, and the total sum of e, f, g and h is 1; e is in a range of 0 to 0.5, f is in a range of 0.5 to 0.98, g is in a range of 0 to 0.2, and h is in a range of 0 to 0.1. In order to optimize the crack resistance of the silicone resin, (e+f)/(e+f+g+h) may be greater than 0.9, preferably greater than 0.95. For example, the upper limit of (e+f)/(e+f+g+h) may be 1.

The linear polyorganosiloxane or the polymerized product may have a viscosity at 25° C. of 1,000 mPa·s to 100,000 mPa·s, preferably 1,000 mPa·s to 50,000 mPa·s. If the viscosity falls within the range, it is possible to maintain excellent processability and workability of the composition before curing and to optimize hardness of the composition after curing.

The linear polyorganosiloxane or the polymerized product may also have a weight average molecular weight ($M_w$) of, for example, 1,000 to 50,000, preferably 1,000 to 30,000. If the $M_w$ of the linear polyorganosiloxane or the polymerized product (A) is not less than 1,000, it is possible to provide a composition that shows an appropriate viscosity and has excellent intensity and crack resistance after curing. Also, if the $M_w$ of the linear polyorganosiloxane or the polymerized product (A) is not more than 50,000, it is possible to optimize viscosity of the composition, thereby maintaining excellent workability and processability.

The linear organosiloxane or the polymerized product may include at least one difunctional siloxane unit represented by Formula 8 and at least one difunctional siloxane unit represented by Formula 9.

$(R^{10}R^{11}SiO)$    [Formula 8]

$(R^{12}R^{13}SiO)$    [Formula 9]

wherein $R^{10}$ and $R^{11}$ independently represent an alkyl group, and $R^{12}$ and $R^{13}$ independently represent an aryl group. In Formulas 5 and 6, specific examples of the alkyl and aryl groups may be the same as defined in Formula 1

In one embodiment, the molar ratio ($100 \times D_9/D$) of the difunctional siloxane unit ($D_9$) of Formula 9 with respect to the total difunctional siloxane units (D) in the polyorganosiloxane may be 30% or more. The molar ratio ($100 \times D_9/D$) may also be in the range from 30% to 65% or from 30% to 60%. If the molar ratio ($100 \times D_9/D$) is 30% or more, it may be possible to provide the silicone resin capable of preventing tackiness on the surface from being generated and having excellent mechanical strength, water and gas transmission properties, and long-term reliability even under high-temperature and/or high-moisture conditions.

The polymerized product may include low-molecular weight cyclic compounds. The term "low-molecular weight cyclic compound" used herein may refer to a cyclic compound, of which the molecular weight is not more than 800, not more than 750 or not more than 700. The cyclic compound may be represented by Formula 10 below.

[Formula 10]

wherein $R^e$ and $R^f$ independently represent an alkyl group, $R^g$ and $R^h$ independently represent an aryl group, q is 0 or a positive number, r is 0 or a positive number, and g+r is in a range from 2 to 10, from 3 to 10, from 3 to 9, from 3 to 8, from 3 to 7 or from 3 to 6. In Formula 10, specific examples of the alkyl and aryl groups may be the same as defined in Formula 1.

The polymerized product may include the cyclic compounds in an amount of 10 weight % or less, 7 weight % or less, 5 weight % or less or 3 weight % or less. The cyclic compound may be included in the polymerized product in an amount of 0 weight % or more, or 1 weight % or more. If the low-molecular weight cyclic compounds are included in an amount of 10 weight % or less, it may be possible to provide the silicone resin having excellent crack resistance, and long-term reliability even under high-temperature and/or high-moisture conditions. The weight ratio of the cyclic compounds may be controlled by eliminating the cyclic compounds remained in the polymerized product after the polymerization process through conventional purification processes.

In one embodiment, the polymerized product may be a ring-opening polymerization reaction product of a mixture comprising a cyclic polyorganosiloxane. The cyclic polyorganosiloxane may be represented by Formula 11 below.

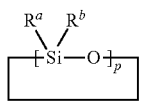
[Formula 11]

wherein $R^a$ and $R^b$ independently represent an alkoxy group, a hydroxy group, an epoxy group or a monovalent hydrocarbon group, and p is in a range of from 2 to 10, from 3 to 10, from 3 to 9, from 3 to 8, from 3 to 7 or from 3 to 6. In Formula 8, specific examples of the alkoxy and monovalent hydrocarbon groups may be the same as in Formula 1. Also, $R^a$ and $R^b$ may be selected in such a way that the linear polyorganosiloxane may be produced.

In one embodiment, the mixture may include at least one compound of Formula 11, in which both of $R^a$ and $R^b$ are alkyl groups, and at least one compound of Formula 11, in which both of $R^a$ and $R^b$ are aryl groups.

The mixture may further include at least one compound represented by Formula 12 below.

$(R^c R^d{}_2 Si)_2 O$ [Formula 12]

wherein $R^a$ to $R^d$ independently represent an alkoxy group, a hydroxy group, an epoxy group or a monovalent hydrocarbon group, and p is in a range of 2 to 10. In Formula 9, specific examples of the alkoxy and monovalent hydrocarbon groups may be the same as defined in Formula 1. Also, $R^c$ and $R^d$ may be selected in such a way that the linear polyorganosiloxane may be produced.

In the above mixture, the specific kinds of substituents, the weight ratio of components, and the like may be selected in such a way that the linear polyorganosiloxane may be produced.

The ring-opening polymerization may be performed in the presence of a suitable catalyst. Therefore, the mixture may further include at least one catalyst. As the catalyst, a base catalyst may be used. Suitable catalysts may be metal hydroxides such as KOH, NaOH or CsOH; metal silanolates including an alkali metal compound and a siloxane compound; or quaternary ammonium compounds such as tetramethylammonium hydroxide, tetraethylammonium hydroxide or tetrapropylammonium hydroxide, but not limited thereto. The weight ratio of the catalyst in the mixture may be suitably controlled considering reactivity, and the like. For example, the catalyst may be included in the mixture in an amount of 0.01 to 30 parts by weight or 0.03 to 5 parts by weight, relative to 100 parts by weight of the total reactants.

In one embodiment, the ring-opening polymerization may be performed in suitable solvents. The specific kinds of the solvents are not particularly limited, but may be selected so as for the reactants such as the cyclic polyorganosiloxane and the catalyst to be uniformly mixed and so as not to adversely affect the reactivity.

The polymerization may be performed in the temperature from 0° C. to 150° C. or from 30° C. to 130° C. The polymerization may be performed for 1 hour to 3 days.

In one embodiment, the silicone resin may be derived from a mixture including the above polymerized product and the crosslinked polyorganosiloxane. The term "crosslinked polyorganosiloxane" refers to a polyorganosiloxane that essentially includes a siloxane unit represented by $(RSiO_{1.5})$ or $(SiO_2)$. In the above, R is a hydroxy group, an epoxy group or a monovalent hydrocarbon group as described in Formula 1.

The crosslinked polyorganosiloxane (B) may be represented by the average composition formula of Formula 13.

$(R^{14}R^{15}R^{16}SiO_{1/2})_i(R^{17}R^{18}SiO)_j(R^{19}SiO_{3/2})_k(SiO_{4/2})_l$ [Formula 13]

wherein $R^{14}$ to $R^{19}$ independently represent an alkoxy group, a hydroxy group, an epoxy group or a monovalent hydrocarbon group, with the provision that at least one of $R^{14}$ to $R^{19}$ is an alkenyl group and at least one of $R^{14}$ to $R^{19}$ is an aryl group; i is in a range of 0 to 0.5, j is in a range of 0 to 0.3, k is in a range of 0.3 to 0.85, 1 is in a range of 0 to 0.2, with the proviso that i+j+k+l is 1, (k+4l/3)/(i+2j) is in a rang of 2 to 5, and k/(k+l) is greater than 0.85.

In the above, $R^{14}$ to $R^{19}$ represent substituents directly bound to a silicon atom, and independently represent an alkoxy, hydroxy, epoxy or monovalent hydrocarbon group. In the above, at least one of $R^{14}$ to $R^{19}$ represents an alkenyl group. Also, in the above, at least one of $R^{14}$ to $R^{19}$ also represents an aryl group. Specific kinds of the respective substituents may be the same as described in Formula 1.

In Formula 13, at least one of $R^{14}$ to $R^{19}$ is an alkenyl group. Particularly, the alkenyl group is included in such an amount that the molar ratio (Ak/Si) of the alkenyl group (Ak) bound to a silicon atom with respect to the total silicon atoms (Si) in the crosslinked polyorganosiloxane is in a range of 0.15 to 0.35, preferably in a range of 0.15 to 0.3. If the molar ratio (Ak/Si) is not less than 0.15, it is possible to optimize reactivity with other components and to prevent components that have not reacted from bleeding on the surface of the silicone resin. Also, if the molar ratio (Ak/Si) is not more than 0.35, it is possible to optimize excellent hardness, crack resistance and thermal shock resistance of the silicone resin.

Also in Formula 13, at least one of $R^{14}$ to $R^{19}$ may be an aryl group, preferably a phenyl group. Therefore, it is possible to optimize the refractive index and hardness of the silicone resin. Particularly, the aryl group, preferably the phenyl group, may be included in such an amount that the molar ratio (Ar/Si) of the aryl group (Ar) with respect to the total silicon atoms (Si) in the crosslinked polyorganosiloxane is in a range of 0.35 to 1.2, preferably in a range of 0.35 to 1.1. If the molar ratio (Ak/Si) is not less than 0.35, it is possible to optimize the refractive index and hardness of the silicone resin. Also, if the molar ratio (Ak/Si) is not more than 1.2, it is possible to maintain an appropriate viscosity and thermal shock resistance.

In the above, i, j, k and l in the average composition formula of Formula 13 represent molar ratios of the siloxane units, respectively, and the total sum of i, f, k and l is 1; i is in a range of 0 to 0.5, j is in a range of 0 to 0.3, k is in a range of 0.3 to 0.85, and 1 is in a range of 0 to 0.2. In order to optimize the intensity, crack resistance and thermal shock resistance of the silicone resin, (k+(4/3)l)/(i+2j) may fall within a range of 2 to 5, preferably a range of 2 to 4, and k/(k+l) may be greater than 0.85, preferably greater than 0.90. For example, the upper limit of k/(k+l) may be 1.

The crosslinked polyorganosiloxane may have a viscosity at 25° C. of more than 5,000 mPa·s, preferably more than 10,000 mPa·s. Therefore, it is possible to maintain appropriate processability before curing and hardness after the curing.

The crosslinked organosiloxane may have a molecular weight of, for example, 1,000 to 5,000, preferably 1,000 to 4,000. If the molecular weight of the polyorganosiloxane is not less than 1,000, it is possible to optimize formability of the composition before curing and intensity of the composition after curing, whereas if the molecular weight of the polyorganosiloxane is not more than 5,000, it is possible to optimize properties such as viscosity.

The crosslinked polyorganosiloxane may be prepared by methods conventionally known in the art. For example, the polyorganosiloxane may be prepared by hydrolyzing and condensing one or more organosilanes having a hydrolyzable group such as a halogen atom or an alkoxy group. For example, the hydrolysis and condensation may be performed in the presence of a typical acid catalyst or a base catalyst. Also, examples of the organosilanes used for the hydrolysis and condensation may include compounds represented by $R_nSiX_{(4-n)}$. In the formula, X is a hydrolyzable group, and may include a halogen such as chlorine or an alkoxy group, and n may be an integer ranging from 0 to 3. Also in the formula, R is a substituent bound to a silicon atom and may be suitably selected in consideration of the substituent of a desired compound. A variety of methods for preparing a siloxane compound, including the methods as described above, have been known in the art, and a desired polyorganosiloxane may be prepared by a person skilled in the art by suitably using one of such methods In one embodiment, in the silicone resin or the mixture, the crosslinked polyorganosiloxane may be, for example, included in an amount of 50 parts by weight to 700 parts by weight, preferably 50 parts by weight to 500 parts by weight, relative to 100 parts by weight of the linear polyorganosiloxane. In this specification, a unit "part by weight" refers to a weight ratio. If the weight ratio is not less than 50 parts by weight, it is possible to maintain excellent intensity of the silicone resin, whereas if the weight ratio is not more than 700 parts by weight, it is possible to maintain excellent crack resistance and thermal shock resistance of the silicone resin.

The silicone resin may be derived from the mixture including the polymerized product, the crosslinked polyorganosiloxane and at least one polyorganosiloxane (hereinafter, referred to as a "hydrogen polyorganosiloxane") including at least one hydrogen atom bound to a silicon atom. The silicone resin may be induced from the mixture including the polymerized product, the crosslinked polyorganosiloxane and the hydrogen polyorganosiloxane.

The hydrogen polyorganosiloxane may be represented by Formula 14.

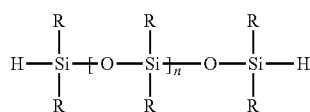

[Formula 14]

wherein R's independently represent hydrogen, an epoxy group or a monovalent hydrocarbon group, with the provision that at least one of the R's is an aryl group; n is in a range of 1 to 10.

The hydrogen polyorganosiloxane has a hydrogen atom directly bound to a silicon atom. The hydrogen atoms may react with the alkenyl groups bound to a silicon atom included in the linear and crosslinked polyorganosiloxanes.

In Formula 14, R's independently represent hydrogen, an epoxy group or a monovalent hydrocarbon group. Specific kinds of the monovalent hydrocarbon group may be the same as described above.

The hydrogen polyorganosiloxane has a molecular chain, both terminal ends of which are blocked by a hydrogen atom bound to a silicon atom. In this case, at least one of the R's included in the molecular side chain may be hydrogen, if desired. Particularly, a molar ratio (H/Si) of the hydrogen atom (H) bound to a silicon atom with respect to the total silicon atoms (Si) in the hydrogen polyorganosiloxane may be in a range of 0.2 to 0.8, preferably in a range of 0.3 to 0.75. If the molar ratio is not less than 0.2, it is possible to maintain excellent curability of the composition, whereas if the molar ratio is not more than 0.8, it is possible to maintain excellent crack resistance and thermal shock resistance.

Also, at least one of the R's in Formula 14 may be an aryl group, preferably a phenyl group. Therefore, the refractive index and hardness of the silicone resin may be optimized. Specifically, the aryl group, preferably the phenyl group, may be included in such an amount that the molar ratio (Ar/Si) of the aryl group (Ar) with respect to the total silicon atoms (Si) in the hydrogen polyorganosiloxane is in a range from 0.3 to 1, from 0.3 to 0.95, from 0.3 to 0.9, from 0.3 to 0.85, from 0.3 to 0.8 or from 0.4 to 0.8. If the molar ratio (Ar/Si) is not less than 0.3, it is possible to optimize the refractive index and hardness of the silicone resin. Also, if the molar ratio (Ar/Si) is not more than 1, it is possible to optimize viscosity and crack resistance of the composition.

In Formula 14, n may be in a range of 1 to 10, in a range of 1 to 5, in a range of 1 to 4, in a range of 1 to 3, or in a range of 1 to 2. Therefore, it is possible to maintain excellent intensity and crack resistance of the silicone resin.

In the above, the hydrogen polyorganosiloxane may have a viscosity at 25° C. of 500 mPa·s or less, preferably 300 mPa·s or less. If the viscosity of the hydrogen polyorganosiloxane falls within the ranges as described above, it is possible to maintain excellent processability of the composition and excellent hardness of the silicone resin.

In one embodiment, the hydrogen polyorganosiloxane may have a molecular weight of, for example, less than 1,000, preferably less than 800. If the molecular weight exceeds 1,000, the intensity of the silicone resin may be deteriorated. A lower limit of the molecular weight is not particularly limited, but may be, for example, 250.

In the above, a method for preparing the hydrogen polyorganosiloxane is used without any particular limitations, and may be, for example, applied in the same manner as in the linear or crosslinked polyorganosiloxane.

In one embodiment, an amount of the hydrogen polyorganosiloxane may be decided upon in order to satisfy a certain molar ratio of the alkenyl groups bound to the silicon atom in the linear and crosslinked polyorganosiloxanes with respect to the total number of alkenyl groups. Particularly, the molar ratio (H/Ak) of the hydrogen atom (H) bound to a silicon atom in the hydrogen polyorganosiloxane with respect to the total alkenyl groups (Ak) bound to a silicon atom in the linear and crosslinked polyorganosiloxanes is in a range of 0.8 to 1.2, preferably in a range of 0.85 to 1.15, and more preferably in a range of 0.9 to 1.1. By controlling the molar ratio (H/Ak) as described above, a composition, which shows excellent processability and workability before curing, which shows excellent crack resistance, hardness, thermal shock resistance and adhesive strength after curing, and which prevents turbidity and tackiness on the surface from being generated under severe conditions may be provided.

The hydrogen polyorganosiloxane may be included in an amount of 50 parts by weight to 500 parts by weight, preferably in a range of 50 parts by weight to 400 parts by weight, relative to 100 parts by weight of the linear polyorganosiloxane or the polymerized product.

A method using the condensation-curable or polycondensation-curable silicone material includes a method of preparing a silicone resin by means of hydrolysis and condensation of a silicon compound or a hydrolysate thereof, such as silane or siloxane, which has a hydrolyzable functional group such as a halogen atom or an alkoxy group. A unit compound which may be used in this method may include a silane compound such as $R^a{}_3Si(OR^b)$, $R^a{}_2Si(OR^b)_2$, $R^aSi(OR^b)_3$ and $Si(OR^b)_4$. In the silane compound, $(OR^b)$ may represent a linear or branched alkoxy group having 1 to 8 carbon atoms, and, more particularly, may be methoxy, ethoxy, n-propoxy, n-butoxy, isopropoxy, isobutoxy, sec-butoxy or t-butoxy. Also in the silane compound, $R^a$ is a functional group bound to a silicon atom, and may be selected in consideration of substituents in a desired silicone resin.

A method using the UV-curable silicone material includes a method, in which a silicon compound, such as silane or siloxane having a UV-reactive group such as an acryloyl group or a hydrolysate thereof is subjected to hydrolysis and condensation so as to prepare a resin, and then preparing a desired resin by UV irradiation.

The addition-curable, condensation-curable or polycondensation-curable, or UV-curable silicone materials are widely known in the art, and a desired resin may be readily prepared using the above-mentioned known materials by a person skilled in the art, depending on a desired silicone resin.

The present application also relates to a semiconductor device that includes a semiconductor element which is encapsulated by an encapsulant including the above silicone resin.

Exemplary kinds of the semiconductor element which may be encapsulated by the encapsulant may include semiconductor devices used in a diode, a transistor, a thyristor, a solid-phase image pickup device, an integral IC and a hybrid IC. Additionally, exemplary examples of the semiconductor device may include a diode, a transistor, a thyristor, a photo-coupler, CCD, an integral IC, a hybrid IC, LSI, VLSI and a light-emitting diode (LED).

In one embodiment, the semiconductor device may be a light-emitting diode that includes a light-emitting element which is encapsulated by an encapsulant including the silicone resin.

Kinds of the light-emitting element which may be used therein are not particularly limited. For example, a light-emitting element formed by stacking a semiconductor material on a substrate may be used. In this case, examples of the semiconductor material may include, but are not limited to, GaAs, GaP, GaAlAs, GaAsP, AlGaInP, GaN, InN, AlN, InGaAlN or SiC. Also, examples of the substrate used herein may include sapphire, spinel, SiC, Si, ZnO or a GaN single crystal.

A buffer layer may also be formed between the substrate and the semiconductor material, when necessary. In this case, a GaN or AlN may be used as the buffer layer. A method of stacking a semiconductor material on a substrate is not particularly limited, but may include, for example, an MOCVD, HDVPE or a liquid phase epitaxy method. A structure of the light-emitting element may include, for example, a mono-junction structure, a heterojunction structure and a double heterojunction structure having an MIS junction, a PN junction, or a PIN junction. Also, the light-emitting device may be formed in a single or multiple quantum well structure.

In one embodiment, an emission wavelength of the light-emitting device may be, for example, in a range of 250 nm to 550 nm, preferably in a range of 300 nm to 500 nm, and more preferably in a range of 330 nm to 470 nm. Here, the emission wavelength represents a peak emission wavelength. When the emission wavelength of the light-emitting device is set to this wavelength, it is possible to obtain a white LED having a longer life span and showing high energy efficiency and color reproduction.

The LED may be manufactured by encapsulating a light-emitting device, particularly a light-emitting device having an emission wavelength of 250 nm to 550 nm, with an encapsulant including the silicone resin. In this case, the encapsulation of the light-emitting device may be performed using only the encapsulant including the silicone resin, and may be performed in combination with another encapsulant, if necessary. If two encapsulants are used together, a light-emitting device may be encapsulated with the encapsulant including the silicone resin, followed by encapsulating the primarily encapsulated light-emitting device with another encapsulant, or may be encapsulated with another encapsulant, followed by encapsulating the primarily encapsulated light-emitting device with the encapsulant including the silicone resin. The other encapsulant which may be used herein may include an epoxy resin, a silicone resin, an acryl resin, a urea resin, an imide resin or glass.

For example, a method of encapsulating a light-emitting device with the encapsulant including the silicone resin includes a method of first injecting a precursor capable of forming the encapsulant including the silicone resin into a mold-type cast, soaking a lead frame, in which a light-emitting device is fixed, in the precursor and curing the precursor. In this case, examples of the method of injecting the precursor may include injection using a dispenser, transfer molding, injection molding, etc. Also, other encapsulation methods used herein may include a method of applying a precursor onto a light-emitting device and curing the precursor by means of a dropping, stencil printing, screen printing or mask process, a method of injecting a precursor into a cup having a light-emitting device disposed therein using a dispenser and curing the precursor, etc. Also, the precursor of the present application may be used as a die-bond material for fixing a light-emitting device in a lead terminal or a package, a passivation film on a light-emitting device, a package substrate, etc.

The method of curing the precursor is not particularly limited, but may be performed, for example, by heating a precursor at a temperature of 60° C. to 200° C. for 10 minutes to 5 hours, and be optionally performed by undergoing at least two steps of the curing process at conditions of suitable temperature and time.

A shape of an encapsulated portion is not particularly limited, but may be formed in a shell-type lens, planar or thin-film shape.

Performances of the LED may also be improved using additional conventionally known methods. Methods of improving the performance may, for example, include a method of installing a light reflective layer or a light-concentrating layer at a rear surface of a light-emitting device, a method of forming a complementarily colored portion at a bottom of a light-emitting device, a method of installing a layer for absorbing light of a wavelength shorter than a main emission peak wavelength on a light-emitting device, a method of encapsulating a light-emitting device and further molding the light-emitting device using a hard material, a method of fixing an LED through a through hole, a method of connecting a light-emitting device to a lead member using a flip chip interconnection, thereby extracting light in a direction of a substrate, etc.

The LED may be, for example, effectively used as a light source such as a backlight unit of a liquid crystal display device (LCD), lightings, various sensors, a printer, or a photocopier, a light source for an automobile dashboard, a traffic light, a pilot lamp, a display device, a light source for a planar luminous body, displays, decorations or various lights.

Advantageous Effects

The silicone resin may show an excellent refractive index, and thus may have excellent light extraction efficiency when it is, for example, applied as an encapsulant for LEDs. Also, the silicone resin shows excellent processability and workability at the time of its application, and excellent crack resistance, hardness, thermal shock resistance and adhesive strength after its application, and has an effect to prevent surface stickiness and turbidity under severe conditions.

BEST MODE

Hereinafter, illustrative embodiments will be described in further detail.

Hereinafter, in these Examples, "Vi" means a "vinyl group," "Ph" means a "phenyl group," "Me" means a "methyl group," and "Ep" means an "epoxy group."

1. Evaluation of Device Properties

A 5630 LED package that was prepared by using a polyphthalamide (PPA) was used to evaluate device properties. Specifically, a curable resin composition was dispensed into a polyphthalamide cup, and cured at a constant temperature of 60° C. for 30 minutes, and then at a constant temperature of 150° C. for 1 hour so as to prepare a surface-mounted type LED. Then, the LED was evaluated for thermal shock and long-term reliability under the high-temperature/high-moisture conditions, as follows.

<Criteria for Evaluation of Thermal Shock>

One cycle, in which of the prepared surface-mounted type LED was left at a constant temperature of −40° C. for 30 minutes, and then was left at a constant temperature of 100° C. for 30 minutes, was repeated 10 times. Then, the surface-mounted type LED was cooled at room temperature, and evaluated for a peeling state to determine the thermal shock resistance (ten surface-mounted type LEDs were prepared in each of Examples and Comparative Examples and evaluated for a peeling state).

<Long-term Reliability at High-temperature/High-moisture Conditions>

The prepared surface-mounted type LED was operated for 100 hours by applying a current of 60 mA under the state where the LED was left at a temperature of 85° C. and a relative humidity of 85%. After the completion of the operation, luminance of the LED was then measured to calculate reduction in luminance with respect to the initial luminance, and reliability was evaluated according to the following criteria.

<Evaluation Criteria>

○: Luminance was reduced by 10% or less with respect to initial luminance

×: Luminance was reduced by 10% or more with respect to initial luminance

[Mode for Invention]

PREPARATION EXAMPLE 1

50.0 g of octamethylcyclotetrasiloxane, 53.5 g of octaphenylcyclotetrasiloxane, 36.7 g of tetramethyltetraphenylcyclotetrasiloxane and 12.6 g of divinyltetramethyldisiloxane were mixed, and then 0.49 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 1 was obtained. Then, the low molecular weight cyclic compounds having the molecular weight of 800 were eliminated via a conventional purification process from the ring opening polymerization reaction product so as for the amount of the cyclic compounds to be 13 weight %.

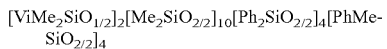  [Formula 1]

PREPARATION EXAMPLE 2

45.0 g of octamethylcyclotetrasiloxane, 66.9 g of octaphenylcyclotetrasiloxane, 36.7 g of tetramethyltetraphenylcyclotetrasiloxane and 12.6 g of divinyltetramethyldisiloxane were mixed, and then 0.52 mL of TMAH (tetramethylammonium hydroxide) was added thereto. Then, a ring opening polymerization reaction was performed. After the reaction, a ring opening polymerization reaction product including a linear organosiloxane compound represented by Formula 5 was obtained. Then, the low molecular weight cyclic compounds having the molecular weight of 800 were eliminated via a conventional purification process from the ring opening polymerization reaction product so as for the amount of the cyclic compounds to be 13 weight %.

  [Formula 5]

PREPARATION EXAMPLE 3

30.0 g of octamethylcyclotetrasiloxane, 80.2 g of octaphenylcyclotetrasiloxane, 88.2 g of tetramethyltetraphenylcyclotetrasiloxane and 15.1 g of divinyltetramethyldisiloxane were mixed, and then 0.68 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 6 was obtained. Then, the low molecular weight cyclic compounds having the molecular weight of 800 were eliminated via a conventional purification process from the ring opening polymerization reaction product so as for the amount of the cyclic compounds to be 13 weight %.

  [Formula 6]

PREPARATION EXAMPLE 4

20.0 g of octamethylcyclotetrasiloxane, 124.8 g of octaphenylcyclotetrasiloxane, 98.0 g of tetramethyltetraphenylcyclotetrasiloxane and 16.8 g of divinyltetramethyldisiloxane were mixed, and then 0.83 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 7 was obtained. Then, the low molecular weight cyclic compounds having the molecular weight of 800 were eliminated via a conventional purification process from the ring opening polymerization reaction product so as for the amount of the cyclic compounds to be 13 weight %.

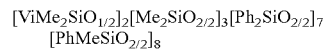  [Formula 7]

PREPARATION EXAMPLE 5

5.0 g of octamethylcyclotetrasiloxane, 120.3 g of octaphenylcyclotetrasiloxane, 73.5 g of tetramethyltetraphenylcyclotetrasiloxane and 12.6 g of divinyltetramethyldisiloxane were mixed, and then 0.68 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 8 was obtained. Then, the low molecular weight cyclic compounds having the molecular weight of 800 were eliminated via a conventional purification process from the ring opening polymerization reaction product so as for the amount of the cyclic compounds to be 13 weight %.

$$[ViMe_2SiO_{1/2}]_2[Me_2SiO_{2/2}][Ph_2SiO_{2/2}]_9$$
$$[PhMeSiO_{2/2}]_8 \quad \text{[Formula 8]}$$

PREPARATION EXAMPLE 6

130.0 g of octaphenylcyclotetrasiloxane, 71.4 g of tetramethyltetraphenylcyclotetrasiloxane and 12.2 g of divinyltetramethyldisiloxane were mixed, and then 0.68 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 9 was obtained. Then, the low molecular weight cyclic compounds having the molecular weight of 800 were eliminated via a conventional purification process from the ring opening polymerization reaction product so as for the amount of the cyclic compounds to be 13 weight %.

$$[ViMe_2SiO_{1/2}]_2[Ph_2SiO_{2/2}]_{10}[PhMeSiO_{2/2}]_8 \quad \text{[Formula 9]}$$

PREPARATION EXAMPLE 7

50.0 g of octamethylcyclotetrasiloxane, 53.5 g of octaphenylcyclotetrasiloxane, 36.7 g of tetramethyltetraphenylcyclotetrasiloxane and 12.6 g of divinyltetramethyldisiloxane were mixed, and then 0.49 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 1 was obtained. Then, the low molecular weight cyclic compounds having the molecular weight of 800 were eliminated via a conventional purification process from the ring opening polymerization reaction product so as for the amount of the cyclic compounds to be 7 weight %.

$$[ViMe_2SiO_{1/2}]_2[Me_2SiO_{2/2}]_{10}[Ph_2SiO_{2/2}]_4[PhMeSiO_{2/2}]_4 \quad \text{[Formula 1]}$$

PREPARATION EXAMPLE 8

20.0 g of octamethylcyclotetrasiloxane, 124.8 g of octaphenylcyclotetrasiloxane, 98.0 g of tetramethyltetraphenylcyclotetrasiloxane and 16.8 g of divinyltetramethyldisiloxane were mixed, and then 0.83 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 7 was obtained. Then, the low molecular weight cyclic compounds having the molecular weight of 800 were eliminated via a conventional purification process from the ring opening polymerization reaction product so as for the amount of the cyclic compounds to be 6 weight %.

$$[ViMe_2SiO_{1/2}]_2[Me_2SiO_{2/2}]_3[Ph_2SiO_{2/2}]_7$$
$$[PhMeSiO_{2/2}]_8 \quad \text{[Formula 7]}$$

PREPARATION EXAMPLE 9

130.0 g of octaphenylcyclotetrasiloxane, 71.4 g of tetramethyltetraphenylcyclotetrasiloxane and 12.2 g of divinyltetramethyldisiloxane were mixed, and then 0.68 mL of TMAH (tetramethylammonium hydroxide) was added thereto. Then, a ring opening polymerization reaction was performed in a temperature of 110° C. for 15 hours.

After the reaction, a ring opening polymerization reaction product including a linear organosiloxane compound represented by Formula 9 was obtained. Then, the low molecular weight cyclic compounds having the molecular weight of 800 were eliminated via a conventional purification process from the ring opening polymerization reaction product so as for the amount of the cyclic compounds to be 7 weight %.

$$[ViMe_2SiO_{1/2}]_2[Ph_2SiO_{2/2}]_{10}[PhMeSiO_{2/2}]_8 \quad \text{[Formula 9]}$$

EXAMPLE 1

The ring opening polymerization reaction product prepared in the preparation example 1 was mixed with the compounds which were represented by the Formulas 2 to 4 as described below. The compounds of Formulas 2 to 4 were prepared by methods conventionally known to a person skilled in the art. Therefore, a mixture including 100 g of a linear polyorganosiloxane (Formula 1), 300 g of a crosslinked polyorganosiloxane (Formula 2), 10.0 g of a tackifier (Formula 3), and 100.0 g of a hydrogen polyorganosiloxane (Formula 4) were prepared. Then, a catalyst (platinum(0)-1,3-divinyl-1,1,3,3-tetramethyldisiloxane) was blended in such an amount that the content of Pt(0) in the resulting mixture was 20 ppm, homogeneously mixed, and degassed to prepare a curable composition $$[ViMe_2SiO_{1/2}]_2[Me_2SiO_{2/2}]_{10}[Ph_2SiO_{2/2}]_4[PhMeSiO_{2/2}]_4 \quad \text{[Formula 1]}$$

$$[ViMeSiO_{2/2}][PhMeSiO_{2/2}][PhSiO_{3/2}]_{14}$$
$$[ViMe_2SiO_{1/2}]_3 \quad \text{[Formula 2]}$$

$$[ViMe_2SiO_{1/2}]_2[EpSiO_{3/2}]_2[PhMeSiO_{2/2}]_{10} \quad \text{[Formula 3]}$$

$$[HMe_2SiO_{1/2}]_2[Ph_2SiO_{2/2}] \quad \text{[Formula 4]}$$

EXAMPLE 2

A curable composition was prepared in the same manner as in Example 1, except that the polymerized product of Preparation Example 2 was used instead of the polymerized product of Preparation Example 1, and the platinum catalyst was mixed with a mixture prepared so as to include 100 g of a linear polyorganosiloxane represented in Formula 5, 300 g of the crosslinked polyorganosiloxane of Formula 2, 10.0 g of the tackifier of Formula 3 and 105.0 g of the hydrogen polyorganosiloxane of Formula 4.

$$[ViMe_2SiO_{1/2}]_2[Me_2SiO_{2/2}]_9[Ph_2SiO_{2/2}]_5$$
$$[PhMeSiO_{2/2}]_4 \quad \text{[Formula 5]}$$

EXAMPLE 3

A curable composition was prepared in the same manner as Example 1, except that the polymerized product of Preparation Example 3 was used instead of the polymerized product of Preparation Example 1, and the platinum catalyst was mixed with a mixture prepared so as to include 100 g of a linear polyorganosiloxane represented in Formula 6, 300 g of the polyorganosiloxane of Formula 2, 10.0 g of the tackifier of Formula 3 and 101.0 g of the polyorganosiloxane of Formula 4.

[Formula 6]

EXAMPLE 4

A curable composition was prepared in the same manner as Example 1, except that the polymerized product of Preparation Example 4 was used instead of the polymerized product of Preparation Example 1, and the platinum catalyst was mixed with a mixture prepared so as to include 100 g of a linear polyorganosiloxane represented in Formula 7, 300 g of the polyorganosiloxane of Formula 2, 10.0 g of the tackifier of Formula 3 and 100.0 g of the polyorganosiloxane of Formula 4.

[Formula 7]

EXAMPLE 5

A curable composition was prepared in the same manner as Example 1, except that the polymerized product of Preparation Example 5 was used instead of the polymerized product of Preparation Example 1, and the platinum catalyst was mixed with a mixture prepared so as to include 100 g of a linear polyorganosiloxane represented in Formula 8, 300 g of the polyorganosiloxane of Formula 2, 10.0 g of the tackifier of Formula 3 and 99.0 g of the polyorganosiloxane of Formula 4.

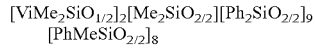
[Formula 8]

EXAMPLE 6

A curable composition was prepared in the same manner as Example 1, except that the polymerized product of Preparation Example 6 was used instead of the polymerized product of Preparation Example 1, and the platinum catalyst was mixed with a mixture prepared so as to include 100 g of a linear polyorganosiloxane represented in Formula 9, 300 g of the polyorganosiloxane of Formula 2, 10.0 g of the tackifier of Formula 3 and 98.0 g of the polyorganosiloxane of Formula 4.

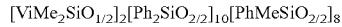
[Formula 7]

EXAMPLE 7

A curable composition was prepared in the same manner as in Example 1, except that the reaction product of Preparation Example 7 was used instead of the reaction product of Preparation Example 1.

EXAMPLE 8

A curable composition was prepared in the same manner as in Example 4, except that the reaction product of Preparation Example 8 was used instead of the reaction product of Preparation Example 4.

EXAMPLE 9

A curable composition was prepared in the same manner as in Example 6, except that the reaction product of Preparation Example 9 was used instead of the reaction product of Preparation Example 6.

TABLE 1

|  | Thermal Shock Test | High-temperature/High-moisture Reliability |
|---|---|---|
| Example 1 | 2/10 | ○ |
| Example 2 | 0/10 | ○ |
| Example 3 | 1/10 | ○ |
| Example 4 | 2/10 | ○ |
| Example 5 | 0/10 | ○ |
| Example 6 | 2/10 | ○ |
| Example 7 | 0/10 | ○ |
| Example 8 | 0/10 | ○ |
| Example 9 | 0/10 | ○ |

As seen from Table 1, it was confirmed that the curable compositions which is the precursor capable of forming the silicone resin of the present application had excellent thermal shock resistance after curing, and showed excellent properties in the high-temperature/high-moisture long-term reliability test.

Test Examples: Measurement of Moisture Permeability, Reliability and Yellowing Prevention Effect In order to confirm effects of the silicone resin including both the siloxane units of Formulas 2 and 3 according to the present application, test samples prepared in the following method were measured for physical properties using the following method.

(1) Measurement of Moisture Permeability

A composition of each test sample was cured at 150° C. for 1 hour so as to prepare a 1 mm-thick planar test sample, and the prepared planar test sample was measured for moisture permeability. Moisture permeability of the planar test sample was measured in a thickness direction in the same conditions using a Mocon tester, and the results are listed in the following Table 2.

(2) Measurement of Reliability Under High-temperature and High-humidity Conditions A composition of each test sample was coated on a glass substrate at the same thickness, cured, and then kept at a temperature of 85° C. and a relative humidity of 85% for 500 hours. Then, peel strength of the silicone resin of the composition to the glass substrate was evaluated in a peel test, and a value of the peel strength was evaluated according to the following criteria, thereby evaluating reliability of the composition under high-temperature and high-moisture conditions.

<Evaluation Criteria>

○: Peel strength to a glass substrate was similar to or greater than 15 gf/mm

×: Peel strength to a glass substrate was less than 15 gf/mm (3) Measurement of Yellowing Each test sample used to measure the moisture permeability was illuminated with light at 60° C. for 3 days using a Q-UVA (340 nm, 0.89 W/Cm$^2$) tester, and evaluated for yellowing according to the following criteria. The results are described as follows.

<Evaluation Criteria>

○: Absorbance of light of 450 nm wavelength was less than 5%

×: Absorbance of light of 450 nm wavelength was 5% or more.

Test Sample A

As the polyorganosiloxanes synthesized by known methods, compounds represented by Formulas A, B, C and D were mixed together so as to prepare a siloxane composition (Mixing ratios: Compound A: 100 g, Compound B: 10 g, Compound C: 200 g, and Compound D: 60 g) which may be cured by hydrosilylation. Then, a catalyst (platinum (0)-1,3-divinyl-1,1,3,3-tetramethyldisiloxane) was mixed in such an amount that the content of Pt(0) in the composition was 20 ppm and homogeneously mixed to prepare a curable composition (A).

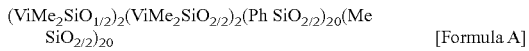
[Formula A]

[Formula B]

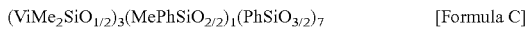
[Formula C]

[Formula D]

Test Sample B

As the polyorganosiloxanes synthesized by known methods, compounds represented by the Formulas E to G were mixed together to prepare a siloxane composition (Blending ratios: Compound E: 100 g, Compound F: 20 g, and Compound G: 50 g) which may be cured by hydrosilylation. Then, a catalyst, (platinum (0)-1,3-divinyl-1,1,3,3-tetramethyldisiloxane), was blended in such an amount that the content of Pt(0) in the composition was 20 ppm and homogeneously mixed to prepare a curable composition (B).

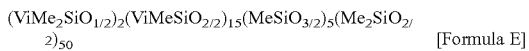
[Formula E]

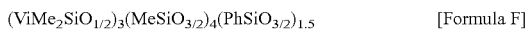
[Formula F]

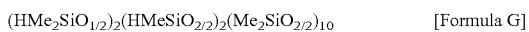
[Formula G]

Test Sample C

As the polyorganosiloxanes synthesized by known methods, compounds represented by Formulas H to J were mixed together to prepare a siloxane composition (Blending ratios: Compound H: 100 g, Compound I: 20 g, Compound J: 50 g) which may be cured by hydrosilylation. Then, a catalyst, (platinum (0)-1,3-divinyl-1,1,3,3-tetramethyldisiloxane), was blended in such an amount that the content of Pt(0) in the composition was 20 ppm and homogeneously mixed to prepare a curable composition (C).

[Formula H]

[Formula I]

[Formula J]

The respective test samples were measured for physical properties, and the results are listed in Table 2, as follows.

TABLE 2

|  | Test Sample A | Test Sample B | Test Sample C |
|---|---|---|---|
| Moisture Permeability | 15 g/cm²/day | 106 g/cm²/day | 120 g/cm²/day |
| Durability/Reliability | ○ | x | x |
| Yellowing | ○ | ○ | x |

As seen in Table 2, it was confirmed that test sample A containing both the siloxane units of Formulas 2 and 3 showed excellent moisture permeability, durability/reliability and yellowing properties, but test sample B containing one of the siloxane units of Formula 2 and 3 as well as test sample C free of the siloxane units of Formulas 2 and 3 show significantly deteriorated physical properties.

The invention claimed is:

1. A silicone resin which is represented by an average composition formula of Formula 1, which comprises a siloxane unit of Formula 2 and a siloxane unit of Formula 3, wherein a molar ratio of aryl groups bound to a silicon atom in the siloxane unit of Formula 2 with respect to total silicon atoms is in a range of 0.4 to 0.8 and a molar ratio of aryl groups bound to a silicon atom in the siloxane unit of the Formula 3 with respect to total silicon atoms is in a range of 0.25 to 0.7:

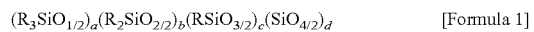
[Formula 1]

[Formula 2]

[Formula 3]

wherein R's are substituents directly bound to a silicon atom, and each independently represents hydrogen, an alkyl group, an aryl group, an alkoxy group, a hydroxy group, an epoxy-containing group, an isocyanate-containing group or a monovalent hydrocarbon group, and at least one of R's is the isocyanate-containing group or the epoxy-containing group;

$R^1$ and $R^2$ each independently represent an alkyl group or an aryl group, $R^3$ represents an aryl group, a is in a range of 0≤a≤0.5, b is in a range of 0.2≤b≤0.8, c is in a range of 0.25≤c≤0.8, and d is in a range of 0≤d≤0.2, with the proviso that a+b+c+d is 1.

2. The silicone resin according to claim 1, wherein a molar ratio of aryl groups bound to the silicon atom with respect to the total silicon atoms is in a range of 0.7 to 1.3.

3. The silicone resin according to claim 1, wherein the aryl group is a phenyl group.

4. The silicone resin according to claim 1, wherein all the aryl groups bound to the silicon atom are comprised in the siloxane unit of Formula 2 or 3.

5. The silicone resin according to claim 1, wherein the siloxane unit of Formula 2 is at least one selected from the group consisting of a siloxane unit of Formula 4 and a siloxane unit of Formula 5:

[Formula 4]

[Formula 5].

6. The silicone resin according to claim 1, wherein the siloxane unit of Formula 2 is a siloxane unit of Formula 5, and wherein the molar ratio of the difunctional siloxane unit of Formula 5 with respect to the total difunctional siloxane units is 30% or more:

[Formula 5].

7. The silicone resin according to claim 2, wherein both of $R^1$ and $R^2$ represent an aryl group.

8. The silicone resin according to claim 2, wherein a ratio of a bifunctional siloxane unit of Formula 2 with respect to the total bifunctional siloxane units is 35 mol % or more.

9. The silicone resin according to claim 2, wherein the siloxane unit of Formula 3 is a siloxane unit represented by Formula 6:

[Formula 6].

10. The silicone resin according to claim 2, wherein a ratio of a trifunctional siloxane unit of Formula 3 with respect to the total trifunctional siloxane units is 70 mol % or more.

11. The silicone resin according to claim 1, wherein the resin has a viscosity of 500 cP to 100,000 cP at 25° C.

12. The silicone resin according to claim 1, wherein the resin has a weight average molecular weight of 300 to 100,000.

13. A semiconductor device comprising a semiconductor element which is encapsulated by an encapsulant that comprises the silicone resin of claim 1.

14. A light-emitting diode comprising a light emitting element which is encapsulated by an encapsulant that comprises a silicone resin, wherein the silicone resin is represented by an average composition formula of Formula 1, wherein the silicone resin comprises a siloxane unit of Formula 2 and a siloxane unit of Formula 3, wherein a molar ratio of aryl groups bound to the silicon atom in the siloxane unit of the Formula 2 with respect to the total silicon atoms is in a range of 0.4 to 0.8 and wherein a molar ratio of aryl groups bound to the silicon atom in the siloxane unit of the Formula 3 with respect to the total silicon atoms is in a range of 0.25 to 0.7:

$$(R_3SiO_{1/2})_a(R_2SiO_{2/2})_b(RSiO_{3/2})_c(SiO_{4/2})_d \quad \text{[Formula 1]}$$

$$R^1R^2SiO_{2/2} \quad \text{[Formula 2]}$$

$$R^3SiO_{3/2} \quad \text{[Formula 3]}$$

wherein R's are substituents directly bound to a silicon atom, and each independently represents hydrogen, an alkyl group, an aryl group, an alkoxy group, a hydroxy group, an epoxy-containing group, a (meth)acryloyl-containing group, an isocyanate-containing group or a monovalent hydrocarbon group, and at least one of R's is the (meth)acryloyl-containing group, the isocyanate-containing group or the epoxy-containing group; $R^1$ and $R^2$ each independently represent an alkyl group or an aryl group, $R^3$ represents an aryl group, a is in a range of $0 \leq a \leq 0.5$, b is in a range of $0.2 \leq b \leq 0.8$, c is in a range of $0.25 \leq c \leq 0.8$, and d is in a range of $0 \leq d \leq 0.2$, with the proviso that a+b+c+d is 1.

15. A liquid crystal display device that comprises the light-emitting diode of claim 14 as a backlight unit.

* * * * *